United States Patent
Murphree et al.

(10) Patent No.: US 10,344,568 B2
(45) Date of Patent: Jul. 9, 2019

(54) DEGRADABLE DEVICES FOR USE IN SUBTERRANEAN WELLS

(71) Applicant: HALLIBURTON ENERGY SERVICES, INC., Houston, TX (US)

(72) Inventors: Zachary R. Murphree, Dallas, TX (US); Michael L. Fripp, Carrollton, TX (US)

(73) Assignee: Halliburton Energy Services Inc., Carrollton, TX (US)

( * ) Notice: Subject to any disclaimer, the term of this patent is extended or adjusted under 35 U.S.C. 154(b) by 867 days.

(21) Appl. No.: 14/394,805

(22) PCT Filed: Oct. 22, 2013

(86) PCT No.: PCT/US2013/066124
§ 371 (c)(1),
(2) Date: Oct. 16, 2014

(87) PCT Pub. No.: WO2015/060826
PCT Pub. Date: Apr. 30, 2015

(65) Prior Publication Data
US 2015/0247382 A1    Sep. 3, 2015

(51) Int. Cl.
*E21B 34/06* (2006.01)
*E21B 41/00* (2006.01)
(Continued)

(52) U.S. Cl.
CPC ............ *E21B 41/00* (2013.01); *E21B 34/063* (2013.01); *E21B 47/122* (2013.01); *H01F 1/053* (2013.01);
(Continued)

(58) Field of Classification Search
CPC .................................................... E21B 34/063
(Continued)

(56) References Cited

U.S. PATENT DOCUMENTS

| | | | | |
|---|---|---|---|---|
| 2,658,284 A | * | 11/1953 | Arps | E21B 47/024 175/41 |
| 4,275,786 A | * | 6/1981 | Lee | E21B 17/023 166/63 |

(Continued)

FOREIGN PATENT DOCUMENTS

WO    2015060826 A1    4/2015

OTHER PUBLICATIONS

Apr. 26, 2016 International Preliminary Examination Report on Patentability for International Application PCT/US2013/066124 (10 pages).

(Continued)

*Primary Examiner* — Giovanna C Wright
(74) *Attorney, Agent, or Firm* — Locke Lord LLP

(57) ABSTRACT

A device for use in a subterranean well can include a component which degrades in the well, the component being at least one of the group comprising: a) an electrical element which conducts electricity in the well, b) a magnetic element which produces a magnetic field in the well, and c) a substrate which structurally supports an electrical circuit. A method of constructing a device for use in a subterranean well can include determining an environmental condition to be experienced by a component of the device in the well, the component being at least one of the group comprising: a) an electrical element which conducts electricity in the well, b) a magnetic element which produces a magnetic field in the well, and c) a substrate which supports an electrical circuit; selecting the component which degrades when exposed to the environmental condition; and incorporating the component into the device.

20 Claims, 7 Drawing Sheets

(51) Int. Cl.
*E21B 47/12* (2012.01)
*H01F 1/053* (2006.01)
*H01F 41/00* (2006.01)
*H01M 2/02* (2006.01)
*H05K 1/18* (2006.01)
*H05K 3/30* (2006.01)

(52) U.S. Cl.
CPC ............ *H01F 41/00* (2013.01); *H01M 2/025* (2013.01); *H05K 1/18* (2013.01); *H05K 3/30* (2013.01); *Y10T 29/4902* (2015.01); *Y10T 29/49108* (2015.01); *Y10T 29/49117* (2015.01); *Y10T 29/49124* (2015.01)

(58) Field of Classification Search
USPC .................................................. 166/376, 318
See application file for complete search history.

(56) References Cited

U.S. PATENT DOCUMENTS

| | | | | |
|---|---|---|---|---|
| 4,851,665 | A * | 7/1989 | Pesavento | E21B 43/17 356/412 |
| 7,409,987 | B2 * | 8/2008 | Fjelde | E21B 17/05 166/66.7 |
| 7,699,101 | B2 * | 4/2010 | Fripp | E21B 33/1208 166/205 |
| 2006/0124310 | A1 | 6/2006 | Lopez de Cardenas et al. | |
| 2007/0044958 | A1 * | 3/2007 | Rytlewski | C09K 8/68 166/250.01 |
| 2007/0227741 | A1 * | 10/2007 | Lovell | E21B 19/22 166/380 |
| 2009/0174409 | A1 * | 7/2009 | Coates | E21B 47/122 324/338 |
| 2010/0032155 | A1 | 2/2010 | Darnell et al. | |
| 2010/0108327 | A1 * | 5/2010 | Swor | E21B 23/06 166/376 |
| 2011/0303294 | A1 | 12/2011 | Soni et al. | |
| 2012/0013893 | A1 * | 1/2012 | Maida | E21B 47/123 356/73.1 |
| 2012/0118582 | A1 | 5/2012 | Soni et al. | |
| 2013/0032357 | A1 * | 2/2013 | Mazyar | E21B 41/00 166/376 |
| 2013/0048290 | A1 | 2/2013 | Howell et al. | |
| 2013/0062063 | A1 | 3/2013 | Baihly et al. | |
| 2013/0146302 | A1 * | 6/2013 | Gaudette | E21B 31/002 166/376 |
| 2013/0206402 | A1 * | 8/2013 | Coon | E21B 23/08 166/255.1 |
| 2013/0264051 | A1 | 10/2013 | Kyle et al. | |
| 2013/0292123 | A1 | 11/2013 | Murphree et al. | |
| 2013/0333891 | A1 | 12/2013 | Fripp et al. | |
| 2014/0144537 | A1 * | 5/2014 | Peters | F16L 55/00 138/108 |
| 2014/0246209 | A1 * | 9/2014 | Themig | E21B 43/14 166/374 |
| 2015/0027723 | A1 | 1/2015 | Fripp | |
| 2015/0027735 | A1 | 1/2015 | Murphree | |
| 2017/0314372 | A1 * | 11/2017 | Tolman | E21B 33/134 |

OTHER PUBLICATIONS

International Search Report with Written Opinion dated Jul. 10, 2014 for PCT Patent Application No. PCT/US2013/066124, 14 pages.

Patel, Prachi; "A Salt and Paper Battery", magazine article, dated Sep. 15, 2009, retrieved Aug. 28, 2013 from http://www.technologyreview.com/news/415325/a-salt-and-paper-battery, 3 pages.

Bourzac, Katherine; "Batteries Made from Regular Paper", magazine article, dated Dec. 9, 2009, retrieved Aug. 28, 2013 from http://www.technologyreview.com/news/416601/batteries-made-from-regular-paper, 4 pages.

E-Magnets UK; "Characteristics of NdFeB Magnets", web page, retrieved Aug. 28, 2013 from http://www.ndfeb-info.com/characteristics.aspx, 2 pages.

Wikipedia; "Carbon Nanotube", web page, retrieved Oct. 9, 2013 from htp://en.wikipedia.org/wiki/Carbon_nanotube, 41 pages.

Mihai Irimia-Vladu, et al; "Green and biodegradable electronics", MaterialsToday magazine article vol. 15, No. 7-8, dated Jul.-Aug. 2012, 7 pages.

Wikipedia; "Carbon nanotube field-effect transistor", web page, retrieved Oct. 9, 2013 from htp://en.wikipedia.org/wiki/Carbon_nanotube_field-effect_trans . . . , 11 pages.

Wikipedia; "Thin film", web page, retrieved Oct. 9, 2013 from htp://en.wikipedia.org/wiki/Thin_film, 5 pages.

* cited by examiner

DEGRADABLE DEVICES FOR USE IN SUBTERRANEAN WELLS

CROSS-REFERENCE TO RELATED APPLICATION

This application is a national stage under 35 USC 371 of International Application No. PCT/US13/66124, filed on 22 Oct. 2013. The entire disclosure of this prior application is incorporated herein by this reference.

TECHNICAL FIELD

This disclosure relates generally to operations performed and equipment utilized in conjunction with subterranean wells and, in one example described below, more particularly provides for degrading components used in wells.

BACKGROUND

Devices used in subterranean wells are typically designed to withstand a harsh, hostile wellbore environment. However, in some cases, such devices could hinder well operations, for example, by restricting production, obstructing access, disrupting another device's function, etc. Therefore, it will be appreciated that improvements are continually needed in the art of constructing and utilizing devices for use in subterranean wells.

DETAILED DESCRIPTION

Figure 1:
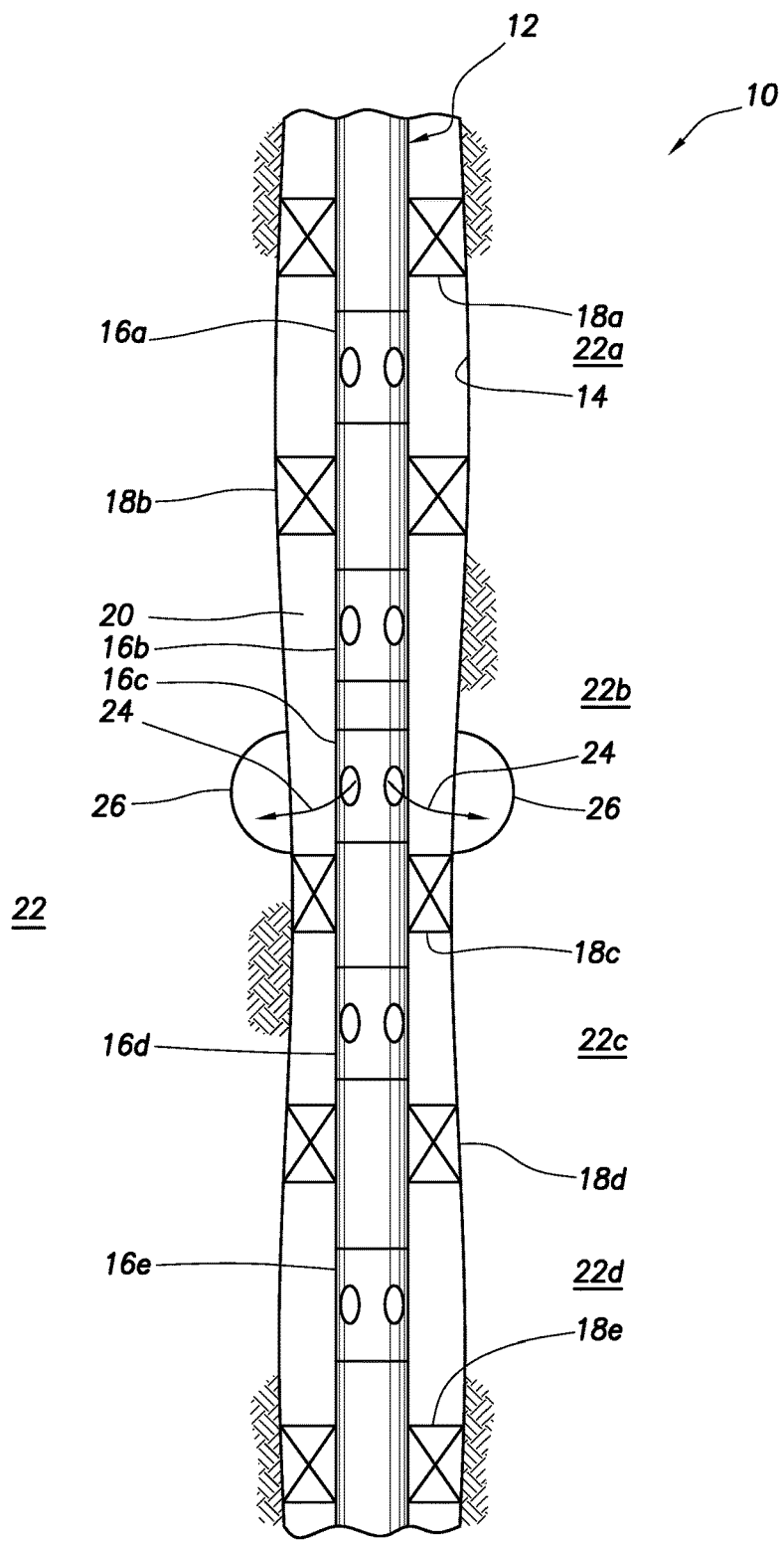
FIG. 1 is a representative partially cross-sectional view of a well system and associated method which can embody principles of this disclosure.

Representatively illustrated in FIG. 1 is a system 10 for use with a well, and an associated method, which can embody principles of this disclosure. In this example, a tubular string 12 is positioned in a wellbore 14, with the tubular string having multiple downhole tools 16a-e, 18a-e interconnected therein. In this example, the downhole tools 16a-e are injection valves, and the downhole tools 18a-e are packers, but other types of downhole tools (such as, samplers, completion tools, data gathering tools, etc.) can incorporate the principles of this disclosure.

In the further description below, selective actuation of the valves 16a-e is described, but it should be understood that the principles of this disclosure can be applied to other types of well operations and other types of downhole tools. For example, the packers 18a-e could be selectively actuated, a sampler or completion tool could be actuated, etc.

The tubular string 12 may be of the type known to those skilled in the art as casing, liner, tubing, a production string, a work string, a drill string, etc. Any type of tubular string may be used and remain within the scope of this disclosure.

The packers 18a-e seal off an annulus 20 formed radially between the tubular string 12 and the wellbore 14. The packers 18a-e in this example are designed for sealing engagement with an uncased or open hole wellbore 14, but if the wellbore is cased or lined, then cased hole-type packers may be used instead. Swellable, inflatable, expandable and other types of packers may be used, as appropriate for the well conditions, or no packers may be used (for example, the tubular string 12 could be expanded into contact with the wellbore 14, the tubular string could be cemented in the wellbore, etc.).

In the FIG. 1 example, the injection valves 16a-e permit selective fluid communication between an interior of the tubular string 12 and each section of the annulus 20 isolated between two of the packers 18a-e. Each section of the annulus 20 is in fluid communication with a corresponding earth formation zone 22a-d. Of course, if packers 18a-e are not used, then the injection valves 16a-e can otherwise be placed in communication with the individual zones 22a-d, for example, with perforations, etc.

The zones 22a-d may be sections of a same formation 22, or they may be sections of different formations. Each zone 22a-d may be associated with one or more of the injection valves 16a-e.

In the FIG. 1 example, two injection valves 16b,c are associated with the section of the annulus 20 isolated between the packers 18b,c, and this section of the annulus is in communication with the associated zone 22b. It will be appreciated that any number of injection valves may be associated with a zone.

It is sometimes beneficial to initiate fractures 26 at multiple locations in a zone (for example, in tight shale formations, etc.), in which cases the multiple injection valves can provide for injecting fluid 24 at multiple fracture initiation points along the wellbore 14. In the example depicted in FIG. 1, the valve 16c has been opened, and fluid 24 is being injected into the zone 22b, thereby forming the fractures 26.

Preferably, the other valves 16a,b,d,e are closed while the fluid 24 is being flowed out of the valve 16c and into the zone 22b. This enables all of the fluid 24 flow to be directed toward forming the fractures 26, with enhanced control over the operation at that particular location.

However, in other examples, multiple valves 16a-e could be open while the fluid 24 is flowed into a zone of an earth formation 22. In the well system 10, for example, both of the valves 16b,c could be open while the fluid 24 is flowed into the zone 22b. This would enable fractures to be formed at multiple fracture initiation locations corresponding to the open valves.

It will, thus, be appreciated that it would be beneficial to be able to open different sets of one or more of the valves 16a-e at different times. For example, one set (such as valves 16b,c) could be opened at one time (such as, when it is desired to form fractures 26 into the zone 22b), and another set (such as valve 16a) could be opened at another time (such as, when it is desired to form fractures into the zone 22a).

One or more sets of the valves 16a-e could be open simultaneously. However, it is generally preferable for only one set of the valves 16a-e to be open at a time, so that the fluid 24 flow can be concentrated on a particular zone, and so flow into that zone can be individually controlled.

At this point, it should be noted that the well system 10 and method are described herein and depicted in the drawings as merely one example of a wide variety of possible systems and methods which can incorporate the principles of this disclosure. Therefore, it should be understood that those principles are not limited in any manner to the details of the system 10 or associated method, or to the details of any of the components thereof (for example, the tubular string 12, the wellbore 14, the valves 16a-e, the packers 18a-e, etc.).

It is not necessary for the principles of this disclosure to be applied in use of valves in a well. For example, the principles described herein can be applied to other well tools, such as, perforating guns, packers, flow control devices, orienting devices, etc. Thus, the scope of this disclosure is not limited to use with any particular type of well tool.

It is not necessary for the wellbore 14 to be vertical as depicted in FIG. 1, for the wellbore to be uncased, for there to be five each of the valves 16a-e and packers, for there to be four of the zones 22a-d, for fractures 26 to be formed in the zones, for the fluid 24 to be injected, etc. The fluid 24 could be any type of fluid which is injected into an earth formation, e.g., for stimulation, conformance, acidizing, fracturing, water-flooding, steam-flooding, treatment, gravel packing, cementing, or any other purpose. Thus, it will be appreciated that the principles of this disclosure are applicable to many different types of well systems and operations.

In other examples, the principles of this disclosure could be applied in circumstances where fluid is not only injected, but is also (or only) produced from the formation 22. In these examples, the fluid 24 could be oil, gas, water, etc., produced from the formation 22. Thus, well tools other than injection valves can benefit from the principles described herein.

Figure 2:
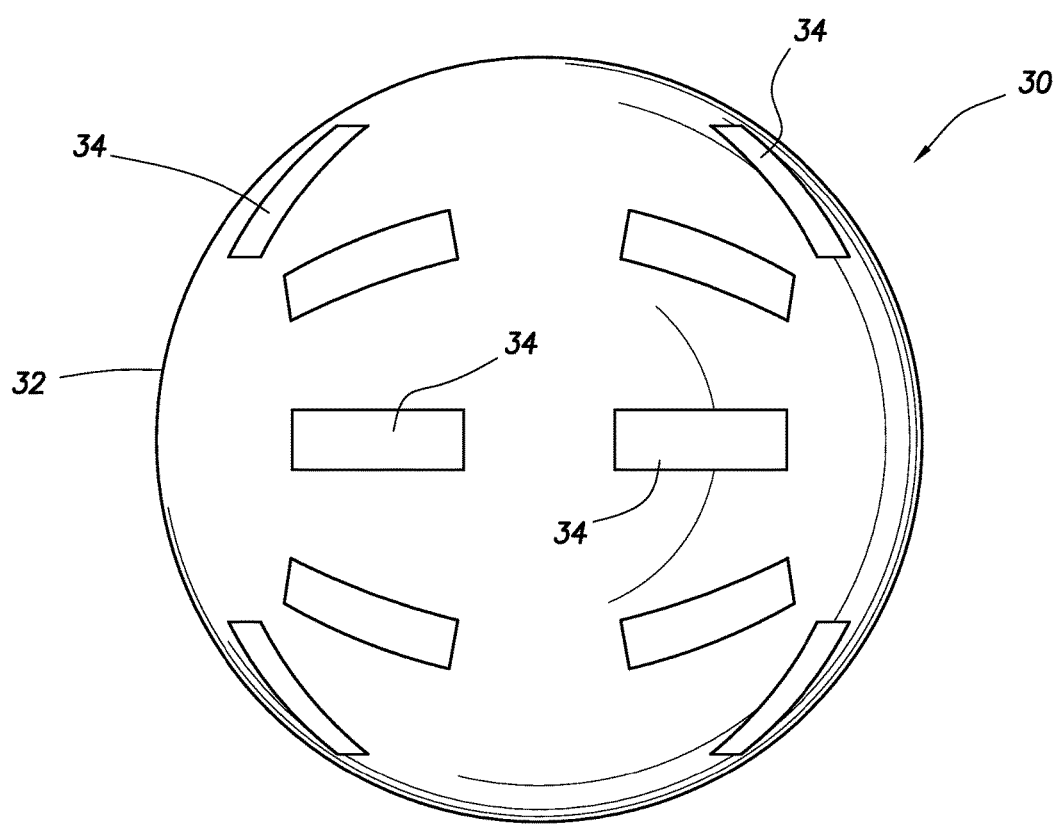
FIG. 2 is an enlarged scale representative side view of a device which may be used in the system and method of FIG. 1.

Referring additionally now to FIG. 2, an example of a device 30 is representatively illustrated. In this example, the device 30 includes a generally spherical body 32 and multiple magnetic elements 34 distributed in the body.

The device 30 can be displaced through the tubular string 12 in the system 10 of FIG. 1, in order to select a particular valve 16a-e to open. The magnetic elements 34 each produce a magnetic field, and the combination of magnetic elements in the device 30 thereby produce a magnetic field having sufficient strength to be detected and recognized by the valves 16a-e.

When a certain number of device(s) 30 is displaced into a corresponding one or more of the valves 16a-e, the one or more of the valves are selected for actuation. Selection of valves for actuation using a device having a magnetic field or a certain magnetic field pattern displaced through a tubular string is described in U.S. patent application Ser. No. 13/440,823 filed on 5 Apr. 2012.

In the FIG. 2 example, it is desired for the magnetic elements 34 to degrade or "disappear" after the device 30 has performed its function of selecting one or more of the valves 16a-e for actuation, so that the magnetic elements do not, for example, obstruct an interior of the tubular string, interfere with subsequent operations (such as, logging operations), hinder operation of other mechanisms, etc. The body 32 of the device 30 may also degrade or "disappear" over time, so that the interior of the tubular string 12 is not obstructed by the body.

The magnetic elements 34 can comprise permanent magnets, electromagnets, magnetostrictive elements, or any other type of elements capable of producing a magnetic field in a well. A suitable permanent magnet material for use as the magnetic elements 34 is neodymium iron boron (NdFeB).

If NdFeB is used, a higher proportion of neodymium can be used (as compared to that commonly used in commercial NdFeB permanent magnets), in order to make the magnetic elements 34 more susceptible to corrosive degradation. For example, brine fluids in the well environment can relatively quickly corrode a NdFeB permanent magnet having a relatively high concentration of neodymium.

If it is desired to delay degradation of the magnetic elements 34, for example, until a certain time period has elapsed, until the device 30 has been exposed to a certain temperature, or until a certain fluid has contacted the device, then the magnetic elements 34 can be provided with a membrane, coating, external layer or other type of enclosure that is impervious until that certain time period, temperature or fluid is experienced in the well environment. Materials which may be useful in such an enclosure include (but are not limited to) poly(lactic) acid, polyglycolic acid, polyvinyl alcohol, shellac, gelatin, saccharides (such as carmelized glucose), cellulose, salt, borate glass, etc. A galvanically reacting coating could be used, such as, composed of magnesium and copper. This galvanic coating could be composed of a nanostructured array of anode and cathode. No enclosure may be used when it is desired for the magnetic elements 34 to immediately begin to degrade in the well environment.

Another way of degrading a permanent magnet in a well is to reduce its magnetic field strength (for example, so that it does not interfere with magnetic instruments such as some logging tools, so that it does not attract ferromagnetic particles and debris, etc.). If a temperature in the well at a location where the device 30 will be used is known or can be estimated, then a permanent magnet can be selected which has a maximum operating temperature rating that is less than the well temperature. In this manner, the magnetic field strength of the permanent magnet will begin decreasing as soon as its maximum operating temperature rating is exceeded in the well.

Figure 3:
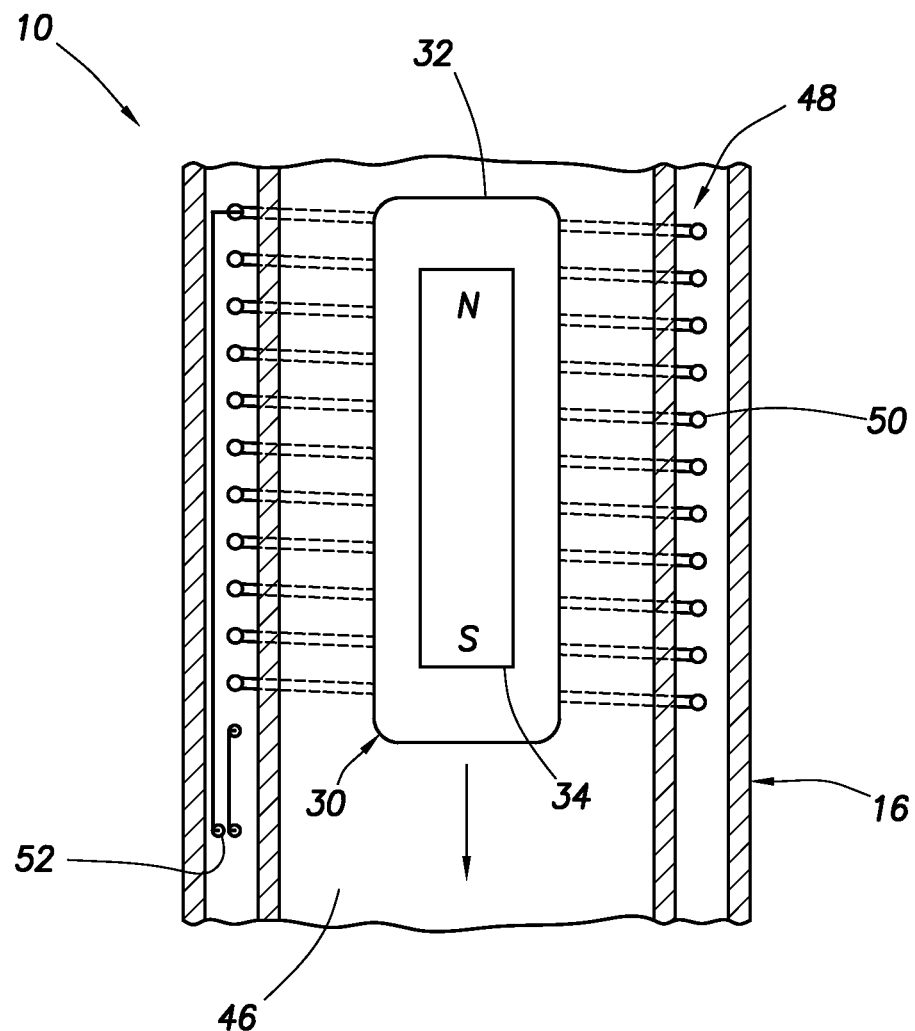
FIG. 3 is a representative partially cross-sectional view of another example of the device in a tubular string of the FIG. 1 system.

Referring additionally now to FIG. 3, another example of the device 30 is representatively illustrated. The device 30 is depicted in FIG. 3 as it is displacing through a passage 46 extending longitudinally through one of the valves 16a-e (indicated by reference number 16 in FIG. 3) in the system 10 of FIG. 1.

In this example, a generator 48 of the valve 16 generates electricity in response to the device 30 (including a magnetic element 34) being displaced through the passage 46. The generator 48 in this example includes a wire coil 50 so that, as the device 30 displaces through the coil, a voltage is produced at a terminal 52 of the coil.

A similar manner of selecting a downhole tool for actuation using a device with a magnetic element therein to generate electricity in the downhole tool is described in U.S. patent application Ser. No. 13/948,278 filed on 23 Jul. 2013. In the device 30 of FIG. 3, however, it is desired for the magnetic element 34 to degrade or "disappear" after the device has performed its function of selecting the valve 16 for actuation.

In this example, the body 32 may serve as an enclosure to temporarily isolate the magnetic element 34 from exposure to well fluids. The enclosure (body 32) eventually dissolves, melts or otherwise degrades, thereby exposing the magnetic element 34 to well fluid, and the magnetic element then degrades (e.g., by corroding).

Figure 4:
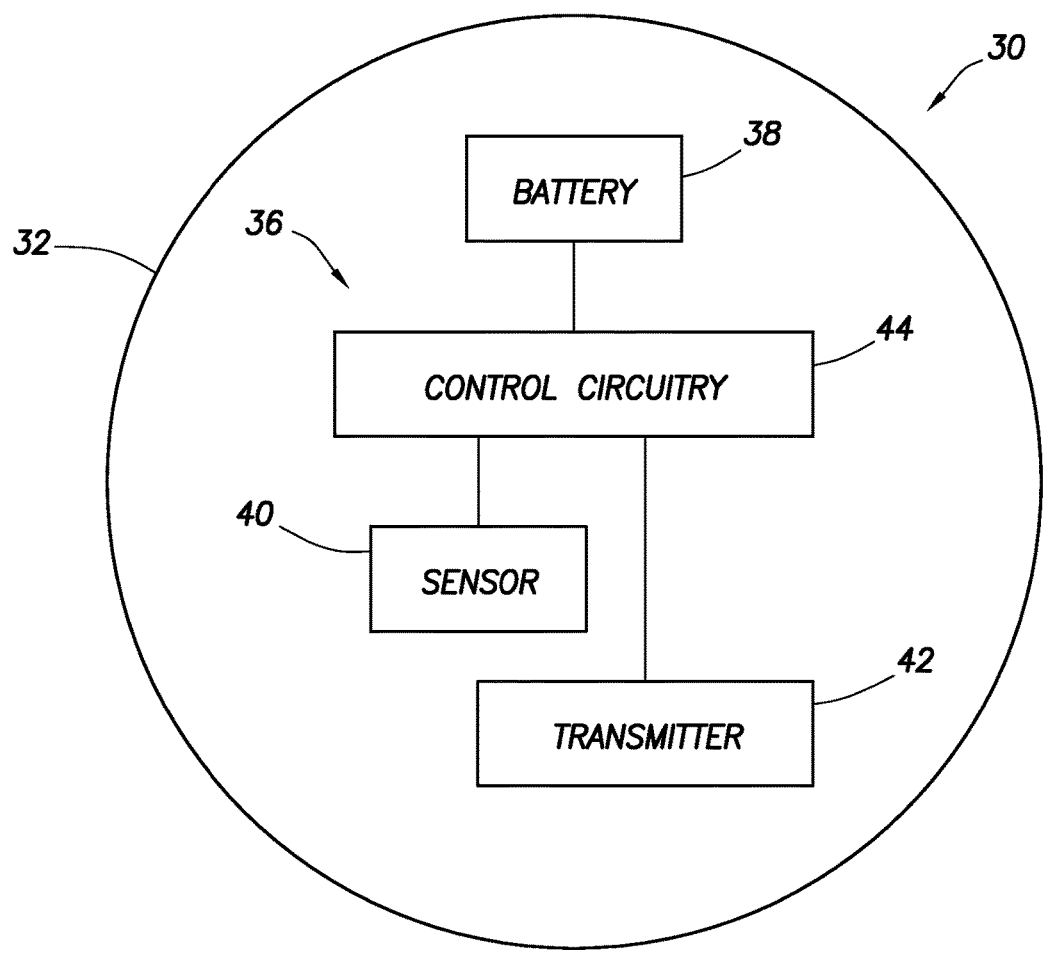
FIG. 4 is a representative schematic view of another example of the device.

Referring additionally now to FIG. 4, another example of the device 30 is representatively illustrated. In this example, the device 30 transmits a particular signal as it displaces through the tubular string 12, with a corresponding one or more of the valves 16a-e being selected by reception of the signal.

In the FIG. 4 example, the device 30 includes a control system 36 in the body 32. Although the body 32 is depicted in FIGS. 2 & 4 as being spherical, in other examples the body could have other shapes, such as a rod, a dart, a wiper, a ball with a tail, etc.

The control system 36 in this example includes an electrical power source 38 (such as, a battery, a charged capacitor, a generator, etc.), a sensor 40 (such as, a magnetic field sensor, an accelerometer, a pressure sensor, an antenna, etc.), a transmitter 42 and control circuitry 44. More, different, or fewer components can be included in other examples of the device 30, and so it should be clearly understood that the scope of this disclosure is not limited to the details of the device as described herein or depicted in the drawings.

The sensor 40 may be used to detect a predetermined stimulus in the well. For example, the sensor 40 can be a magnetic field sensor which detects a magnetic field produced by each of the valves 16a-e. Alternatively, or in addition, the sensor 40 can detect other stimulus in a downhole environment (such as, pressure and/or temperature, etc.). The scope of this disclosure is not limited to use of any particular type of sensor(s).

The control circuitry 44 is used to determine whether the transmitter 42 should be supplied with electrical power from the power source 38 to transmit energy to the selected one or more of the valves 16a-e. For example, the circuitry 44 may cause the transmitter 42 to transmit energy only when the sensor 40 detects that a predetermined number of valves 16a-e have been traversed by the device 30, only when the sensor detects that a threshold pressure or temperature has been reached, etc.

In this manner, electrical power stored by the power source 38 can be conserved until it is used to activate a valve 16a-e and/or the transmitter 42 can transmit energy to activate only a desired one or more of multiple tools (e.g., by transmitting energy only when the device 30 is proximate the tool(s) which it is desired to activate). For making such decisions and causing the transmitter 42 to transmit energy at appropriate time(s), the circuitry 44 can include one or more processors, memory (volatile and/or non-volatile, programmable, etc.), signal conditioners, switches, etc. The scope of this disclosure is not limited to use of any particular type or configuration of control circuitry.

The transmitter 42 can be any type of transmitter that can transmit energy to the selected valve(s) 16a-e. For example, the valves 16a-e can each include a conductive coil or antenna that can receive electromagnetic energy from the transmitter (e.g., via inductive coupling), in which case the transmitter 42 can also be in the form of a conductive coil or antenna capable of transmitting electromagnetic energy.

In other examples, the transmitter 42 can be in the form of a vibrator (for transmitting kinetic energy), a heat source (such as, thermite for transmitting thermal energy), etc. An energy receiver of each valve 16a-e could be in the form of a power "harvester" (such as, an energy harvester, one suitable example of which is a VOLTURE™ energy harvester marketed by Mide Technology of Medford, Mass. USA) if the transmitter 42 transmits kinetic energy, a thermoelectric generator if the transmitter transmits thermal energy, etc. The scope of this disclosure is not limited to use of any particular type of transmitter or receiver.

Actuation of selected ones of multiple downhole tools using a control system in a device displaced through a tubular string is described in U.S. patent application Ser. No. 13/948,267 filed on 23 Jul. 2013. In the device 30 of FIG. 4, however, it is desired for some or all of the components of the control system 36 to degrade or "disappear" after the device has performed its function of selecting a particular one or more of the valves 16a-e for actuation.

Figure 5:
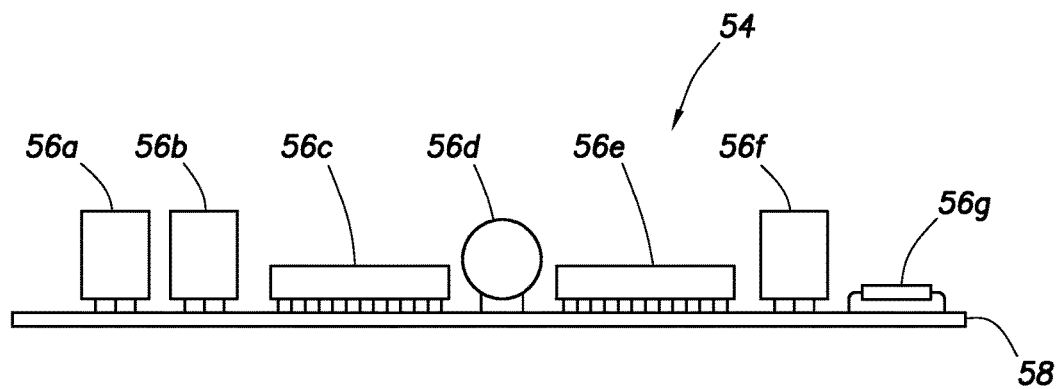
FIGS. 5 & 6 are representative side and bottom views of electronic circuitry that may be used in the device.
Figure 6:
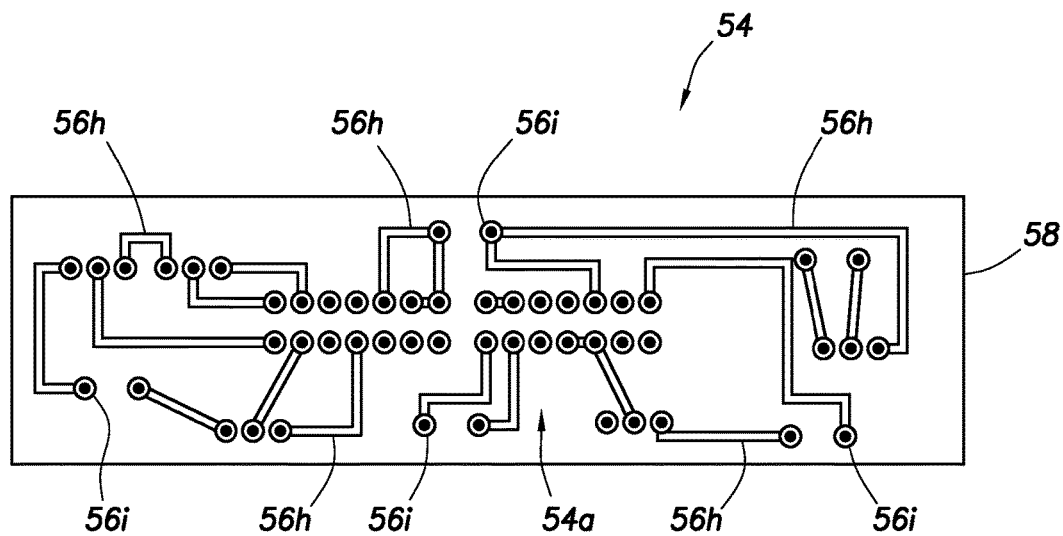

Referring additionally now to FIGS. 5 & 6, an example of electronic circuitry 54 that may be used as the control circuitry 44 in the FIG. 4 example of the device 30 is representatively illustrated. In the FIGS. 5 & 6 examples, the circuitry 54 includes multiple electrical elements 56a-i, some or all of which are designed to degrade or "disappear" in the well environment.

The electrical elements 56a-g can comprise resistors, capacitors, processors, memory, batteries and/or other types of electrical components. The electrical elements 56a-g can be made up of cases, dielectrics, metallic materials, etc., which are designed to degrade in the well environment.

For example, metallic parts (e.g., leads, connectors, shielding, conductors, etc.) can be made of fusible materials (such as, alloys of tin, indium, bismuth, lead and/or cadmium) having melting point temperatures less than a temperature to be experienced in the well environment. The metallic parts of the electrical elements 56a-g will, thus, melt after they are exposed to the well temperature.

In some examples, metallic parts could be constructed of galvanically reacting materials. Magnesium and copper could be suitably combined in the metallic parts. Nanostructures could include arrays of anode and cathode.

Cases or dielectrics of the electrical elements 56a-g can be made of materials that dissolve in well fluids, or that soften or melt at well temperatures (such as, poly(lactic) acid, polyglycolic acid, polyvinyl alcohol, silk, shellac, gelatin, saccharides, carmelized glucose, cellulose, borate glass, etc.).

The electrical elements 56h can comprise conductive traces on or in a circuit board or substrate 58, with the conductive traces electrically connecting the other electrical elements. In one example, the electrical elements 56h could be made of carbon nanotubes deposited as conductive traces on the substrate 58. When the substrate 58 degrades, the electrical elements 56h can be dispersed in fluids in the well.

The electrical elements 56i can comprise solder, for example, electrically connecting the electrical elements 56a-g to the electrical elements 56h to form an electrical circuit 54a. The solder can comprise fusible materials (such as, alloys of tin, indium, bismuth, lead and/or cadmium) having melting point temperatures less than a temperature to be experienced in the well environment.

The solder can, thus, melt and release the other electrical elements 56a-g from the substrate 58 (and from each other) when the solder is exposed to the well temperature. In other examples, metallic parts of the electrical elements 56a-g and/or 56i can be made of a material which is susceptible to corrosive degradation in well fluid. These materials can also (or alternatively) have a galvanic potential that aids in their decomposition.

The electrical elements 56a-i and electrical circuit 54a formed by the electrical elements are supported by the substrate 58 that is also designed to degrade or "disappear" in the well environment. The substrate 58 may be configured similar to a printed circuit board, but in some examples, the substrate may be flexible and may have other shapes (i.e., not necessarily a rigid "board" shape).

The substrate 58 may soften or melt at a temperature experienced in the well. Examples of suitable materials for the substrate 58 include (but are not limited to) poly(lactic) acid, polyglycolic acid, polyvinyl alcohol, silk, shellac, salt, gelatin, saccharides, carmelized glucose, cellulose, borate glass, etc.

Figure 7:
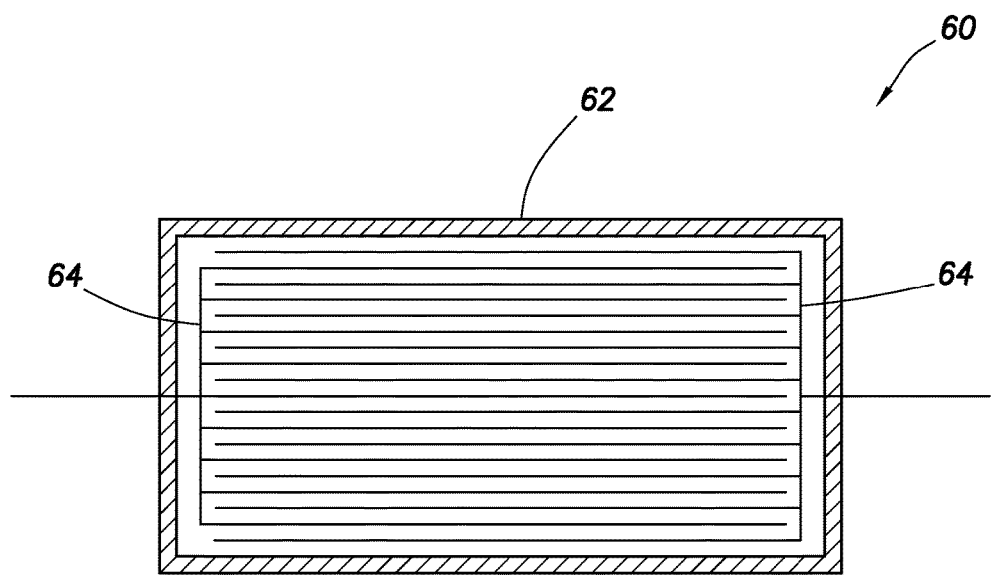
FIGS. 7 & 8 are representative cross-sectional and side views of examples of a battery that may be used in the device.

Referring additionally now to FIG. 7, an example of a battery 60 that can degrade in the well is representatively illustrated. The battery 60 could, for example, be used for the power source 38 in the device 30 of FIG. 4.

The battery 60 may be of the type known to those skilled in the art as a polymer or gel cell, although other types of battery configurations may be used in keeping with the scope of this disclosure. For example, a cellulose and salt battery chemistry could be used.

A case 62 of the battery 60 may be made of a plastic, metal alloy or other material that softens, melts, dissolves, corrodes by galvanic action, or otherwise degrades in the well. For example, if the case 62 is metallic, a fusible alloy material may be used which melts at an expected well temperature. Other materials (such as, poly(lactic) acid, polyglycolic acid, polyvinyl alcohol, silk, shellac, gelatin, saccharides, carmelized glucose and/or cellulose, salt, borate glass, etc.) may be used, which dissolve in expected well fluids.

Electrodes 64 of the battery 60 could comprise impregnated paper sheets or strips. The paper sheets or strips could be dipped in carbon nanotubes, so that they are conductive. The paper will eventually degrade in well fluids, allowing the carbon nanotubes to disperse.

Figure 8:
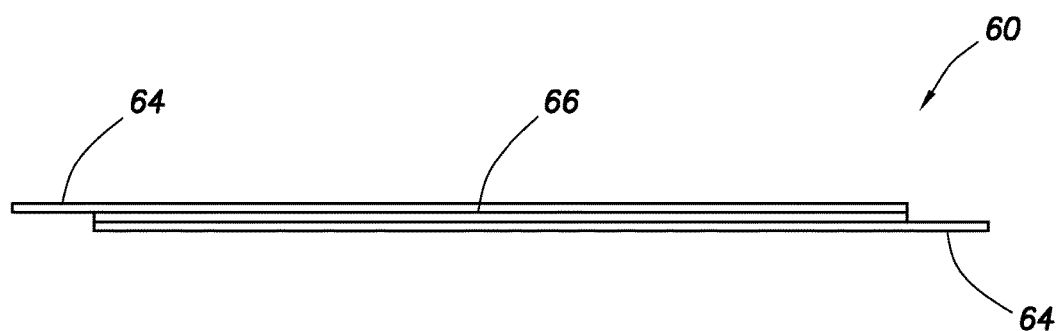

Referring additionally now to FIG. 8, another example of the battery 60 is representatively illustrated. In this example, the battery 60 is in a form known to those skilled in the art as a "thin film" battery.

For example, solid-state lithium polymers may be applied to any of a variety of degradable substrates (such as, poly(lactic) acid, polyglycolic acid, polyvinyl alcohol, silk, shellac, gelatin, saccharides, carmelized glucose, cellulose, etc.). In other examples, a thin degradable solid electrolyte 66 could be positioned between thin degradable electrodes 64. In any of these examples, the resulting battery 60 configuration could be in a rigid or a flexible form.

Figure 9:
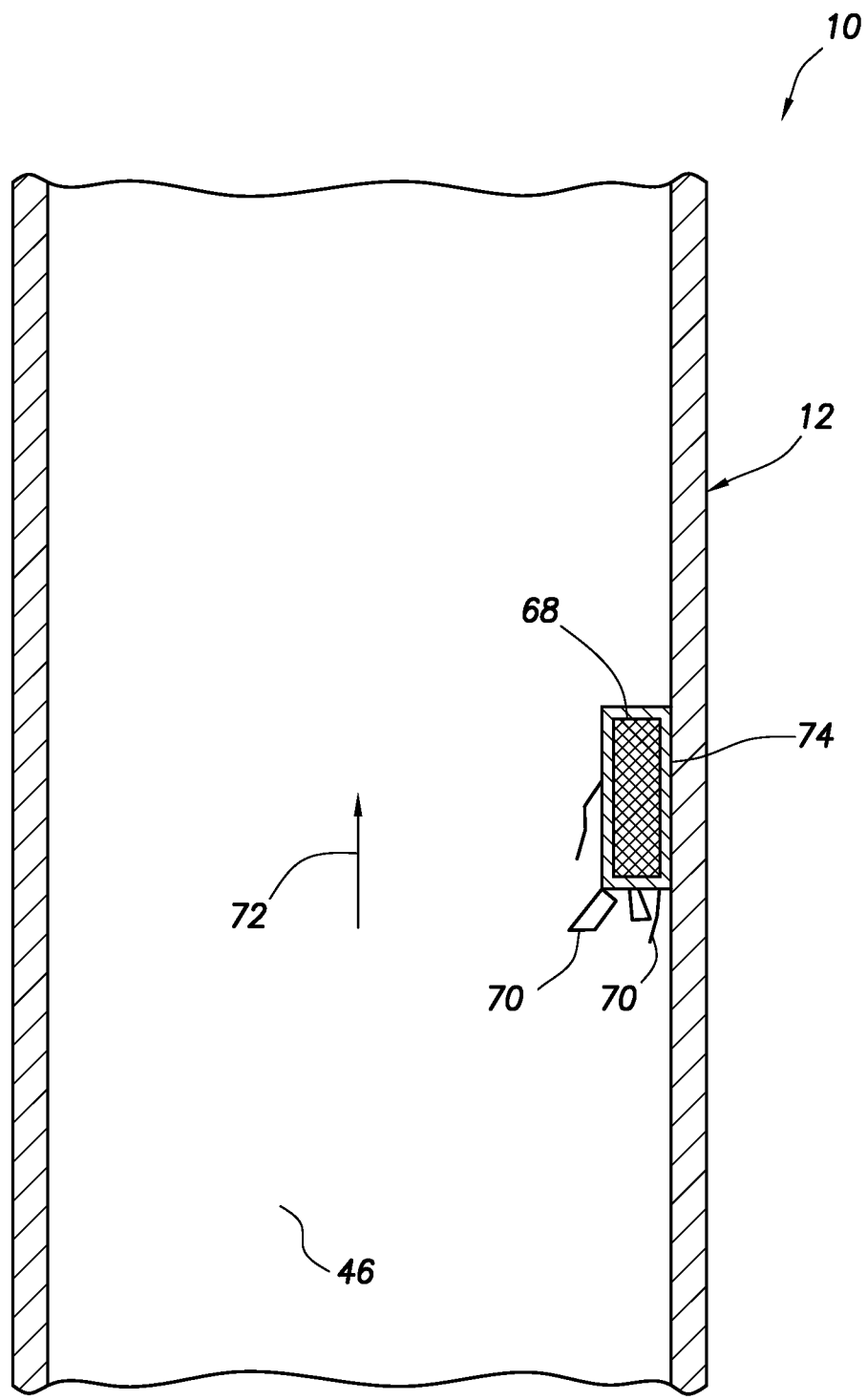
FIG. 9 is a representative cross-sectional view of a magnet of the device in a tubular string of the FIG. 1 system.

Referring additionally now to FIG. 9, a section of the tubular string 12 in the system 10 of FIG. 1 is representatively illustrated. In this example, the device 30 (not visible in FIG. 9, see FIGS. 2-4) has partially degraded, and a permanent magnet 68 remains in the tubular string 12.

For example, the magnet 68 could be one of the magnetic elements 34 of the FIG. 2 or 3 device 30 remaining after the body 32 of the device has dissolved, melted or otherwise degraded. In other examples, the magnet 68 could be included as part of the device 30 (e.g., in the FIG. 4 device) specifically for use after the device has been partially degraded. In another example, the magnet 68 could be included as part of the device 30, in order to secure the electronics in place within a wellbore for sufficient time to allow degradation to occur.

It may be desirable for the magnet 68 to at least temporarily remain in the tubular string 12 after the device 30 has partially degraded. In this manner, the magnet 68 can become magnetically attached to an interior of the tubular string 12, and can attract to the magnet any remaining ferromagnetic elements 70 of the device 30 (such as, leads, electrodes, wires, shields, etc.), or any other magnetic debris, for example, that might otherwise be produced with fluid 72 flowing through the tubular string. This will prevent the elements 70 or other magnetic debris from fouling or plugging other devices, tools or equipment of the well.

The magnet 68 may be designed to degrade after the ferromagnetic elements 70 in the well environment. In this manner, the magnet 68 will retain the elements 70 attached to the interior of the tubular string 12 until they degrade, after which time the magnet itself will degrade.

A membrane, coating, outer layer or other type of enclosure 74 may be provided on the magnet 68, with the enclosure being designed to delay exposure of the magnet to well fluid. The enclosure 74 may then degrade in the well environment, in order to expose the magnet 68 to the well environment.

In other examples, the magnet 68 may be designed so that it does not appreciably degrade in the well environment, in which case the magnet and the elements 70 may be retrieved from the tubular string 12 using an appropriately designed retrieving tool. A membrane, coating, outer layer or other enclosure 74 may be provided on the magnet 68, with the membrane, coating or outer layer being designed to prevent exposure of the magnet to well fluid.

It may now be fully appreciated that the above disclosure provides significant advancements to the art of constructing and utilizing devices for use in wells. In examples described above, components of a device 30 are designed to degrade in a well environment so that, after the device has performed its function, the components will not interfere with well operations. The components may include electrical or magnetic elements, and/or a substrate for supporting an electrical circuit.

In one aspect, a device 30 for use in a subterranean well is described above. In one example, the device 30 can include a component which degrades in the well, the component being at least one of the group comprising: a) an electrical element 56a-i which conducts electricity in the well, b) a magnetic element 34, 68 which produces a magnetic field in the well, and c) a substrate 58 which structurally supports an electrical circuit 54a.

Where the component is the magnetic element 34, 68, the magnetic element may comprise a permanent magnet. The permanent magnet may comprise neodymium iron boron. The permanent magnet can be enclosed in an enclosure 74 (or the body 32 in the FIG. 3 example) or another membrane, coating or outer layer which degrades in the well.

Where the component is the electrical element 56a-i, the electrical element may comprise a battery 60, a solder or other electrical trace (such as, electrical element 56i of FIG. 6) and/or a dielectric (such as, in any of the electrical elements 56a-g) which degrades in the well.

A method of constructing a device 30 for use in a subterranean well is also provided to the art by the above disclosure. In one example, the method can comprise: determining an environmental condition to be experienced by a component of the device 30 in the well, the component being at least one of the group comprising: a) an electrical element 56a-i which conducts electricity in the well, b) a magnetic element 34, 68 which produces a magnetic field in the well, and c) a substrate 58 which supports an electrical circuit 54a; selecting the component which degrades when exposed to the environmental condition; and incorporating the component into the device 30.

Wherein the component is the magnetic element 34, 68, the environmental condition may comprise a well temperature greater than a maximum operating temperature rating of the magnetic element 34, 68. The environmental condition may comprise a fluid (such as brine) which corrodes the magnetic element 34, 68.

Where the component is the electrical element 56i, and the electrical element 56i comprises a conductive fusible material, the environmental condition may comprise a well temperature greater than a melting point of the fusible material.

Where the component is the electrical element 56f, and the electrical element comprises a battery 60, the environmental condition may comprise a well temperature greater than a melting point of a case 62 of the battery 60. The environmental condition may comprise a well fluid which dissolves the case 62 of the battery 60. The environmental condition may comprise a well fluid which dissolves an electrode 64 of the battery 60.

Wherein the component is the electrical element 56a-g, the electrical element may include a dielectric which degrades in the well.

A system 10 for use with a well is also described above. In one example, the system 10 can include a tubular string 12 including multiple downhole tools (such as valves 16a-e or packers 18a-e), a device 30 which displaces through the tubular string 12 and causes a selected at least one of the downhole tools to actuate, the device 30 comprising a component which degrades in the well, the component being at least one of the group comprising: a) an electrical element 56a-i which conducts electricity in the well, b) a magnetic element 34, 68 which produces a magnetic field in the well, and c) a substrate 58 which supports an electrical circuit 54a in the device 30.

Although various examples have been described above, with each example having certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Although each example described above includes a certain combination of features, it should be understood that it is not necessary for all features of an example to be used. Instead, any of the features described above can be used, without any other particular feature or features also being used.

It should be understood that the various embodiments described herein may be utilized in various orientations, such as inclined, inverted, horizontal, vertical, etc., and in various configurations, without departing from the principles of this disclosure. The embodiments are described merely as examples of useful applications of the principles of the disclosure, which is not limited to any specific details of these embodiments.

In the above description of the representative examples, directional terms (such as "above," "below," "upper," "lower," etc.) are used for convenience in referring to the accompanying drawings. However, it should be clearly understood that the scope of this disclosure is not limited to any particular directions described herein.

The terms "including," "includes," "comprising," "comprises," and similar terms are used in a non-limiting sense in this specification. For example, if a system, method, apparatus, device, etc., is described as "including" a certain feature or element, the system, method, apparatus, device, etc., can include that feature or element, and can also include other features or elements. Similarly, the term "comprises" is considered to mean "comprises, but is not limited to."

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. For example, structures disclosed as being separately formed can, in other examples, be integrally formed and vice versa. Accordingly, the foregoing detailed description is to be clearly understood as being given by way of illustration and example only, the spirit and scope of the invention being limited solely by the appended claims and their equivalents.

What is claimed is:

1. A device for use in a subterranean well, the device comprising:
    a spherical body that holds a component which degrades by a galvanic reaction in the well, the component being either an electrical element which conducts electricity in the well, a magnetic element which produces a magnetic field in the well, or a substrate which supports an electrical circuit.

2. The device of claim 1, wherein the component is the magnetic element, and wherein the magnetic element comprises a permanent magnet.

3. The device of claim 2, wherein the permanent magnet comprises neodymium boron.

4. The device of claim 2, wherein the permanent magnet is enclosed in an enclosure which degrades in the well.

5. The device of claim 1, wherein the component is the electrical element, and wherein the electrical element comprises a battery.

6. The device of claim 1, wherein the component is the electrical element, and wherein the electrical element comprises an electrical trace.

7. The device of claim 1, wherein the component is the electrical element, and wherein a case of the electrical element degrades in the well.

8. A method of constructing a device for use in a subterranean well, the method comprising:
    selecting a component which degrades by a galvanic reaction when exposed to an environmental condition to be experienced by the component in the well, the component comprising either:
    a) an electrical element which conducts electricity in the well,
    b) a magnetic element which produces a magnetic field in the well, or
    c) a substrate which supports an electrical circuit; and
    supporting the component via a spherical device.

9. The method of claim 8, wherein the component is the magnetic element, and wherein the environmental condition comprises a well temperature greater than a maximum operating temperature rating of the magnetic element.

10. The method of claim 8, wherein the component is the magnetic element, and wherein the environmental condition comprises a fluid which corrodes the magnetic element.

11. The method of claim 8, wherein the component is the electrical element, wherein the electrical element comprises an conductive fusible material, and wherein the environmental condition comprises a well temperature greater than a melting point of the fusible material.

12. The method of claim 8, wherein the component is the electrical element, wherein the electrical element comprises a battery, and wherein the environmental condition comprises a well temperature greater than a melting point of a case of the battery.

13. The method of claim 8, wherein the component is the electrical element, wherein the electrical element comprises a battery, and wherein the environmental condition comprises a well fluid which dissolves a case of the battery.

14. The method of claim 8, wherein the component is the electrical element, wherein the electrical element comprises a battery, and wherein the environmental condition comprises a well fluid which dissolves an electrode of the battery.

15. The method of claim 8, wherein the component is the electrical element, wherein the electrical element comprises a dielectric which degrades in the well.

16. A well system, comprising:
   a tubular string including multiple downhole tools;
   a device with a spherical body which displaces through the tubular string and causes a selected at least one of the downhole tools to actuate, the device comprising a component supported by the spherical body, the component being configured to degrade by a galvanic reaction in the well, the component comprising either an electrical element which conducts electricity in the well, a magnetic element which produces a magnetic field in the well, or a substrate which supports an electrical circuit in the device.

17. The well system of claim 16, wherein the component is the magnetic element, and wherein the magnetic element comprises a permanent magnet.

18. The well system of claim 17, wherein the permanent magnet comprises neodymium iron boron.

19. The well system of claim 16, wherein the component is the electrical element, and wherein the electrical element comprises a battery.

20. The well system of claim 16, wherein the component is the electrical element, and wherein the electrical element comprises a fusible material.

* * * * *